United States Patent [19]

Ito

[11] Patent Number: 5,267,124
[45] Date of Patent: Nov. 30, 1993

[54] CONTROLLING APPARATUS WITH TERMINAL ARRANGEMENT

[75] Inventor: Eizi Ito, Aichi, Japan

[73] Assignee: Mitsubishi Denki K.K., Tokyo, Japan

[21] Appl. No.: 895,803

[22] Filed: Jun. 9, 1992

[30] Foreign Application Priority Data

Jun. 24, 1991 [JP] Japan .................. 3-152000
Sep. 30, 1991 [JP] Japan .................. 3-251456

[51] Int. Cl.⁵ ............................................ H01R 13/00
[52] U.S. Cl. .................................................. 361/785
[58] Field of Search ........................... 361/412–415;
439/65, 74, 76, 709, 715

[56] References Cited

U.S. PATENT DOCUMENTS 3,007,131 10/1961 Dahlgren et al. ................ 439/709
3,991,346 11/1976 Reid et al. ........................ 439/709
4,530,558 7/1985 Reimer ............................. 439/709
4,795,376 1/1989 Franke et al. .................... 439/715

FOREIGN PATENT DOCUMENTS 0103412 3/1984 European Pat. Off. .
0171687 2/1986 European Pat. Off. .
0194962 9/1986 European Pat. Off. .
1-115371 8/1989 Japan .
2-105903 4/1990 Japan .

Primary Examiner—Joseph H. McGlynn

[57] ABSTRACT

An inverter module design having layered printed wiring boards for main and control circuit components, the printed wiring boards having external terminals for connection to external wiring, the terminals on adjacent boards being arranged orthogonally. An optional printed wiring board is connectable to the control circuit board by quick-connect, one-touch mated connectors.

8 Claims, 6 Drawing Sheets

CONTROLLING APPARATUS WITH TERMINAL ARRANGEMENT

BACKGROUND OF THE INVENTION

1. Field of the Invention

The present invention relates to a controlling apparatus and more particularly to a controlling apparatus, such as an inverter, which has been arranged for ease of wiring and handling.

2. Description of the Background Art

Inverters have become important to machine systems used in various industrial fields, particularly as a speed control apparatus for motors in such machine systems. Often, in complex systems employing plural motors, several controllers are mounted together on a common panel in a confined space, necessitating designs that minimize the area required for installation and wiring yet permit easy access for maintenance and repair. However, in direct conflict with this goal, a larger number of functions with greater sophistication have been added to inverters. Even though further reductions in the inverter size may be possible as chip functions are integrated and chip size is reduced, certain basic requirements prevent the panel arrangement for plural controllers from becoming compact.

An inverter unit consists of a main circuit printed wiring board (PWB) with heat generating components such as diode modules and transistor modules that usually are mounted on a PWB rear side, and capacitors, connectors, protective function circuit components and terminal blocks that usually are mounted on the PWB front side. The main circuit PWB is fixed to the inside of an aluminum die casting chassis that is constructed with heat radiation fins, acting as a heat sink. Since the base surfaces of the heat generating diode modules and transistor modules, which are installed on the rear side of the main circuit PWB, are in direct contact with the inside surface of the metal chassis, heat generated by the modules will be conducted through the chassis and radiated from the heat sink structure which extends from the chassis.

Also forming a part of the inverter unit are electric components which constitute a control circuit on a control circuit pWB. The control circuit PWB has terminal blocks for external wiring connection and is installed on the top side of main circuit PWB. Further, an option circuit PWB also may be installed on the top side of the control circuit PWB. This arrangement of main circuit PWB, control circuit PWB and optional function PWB are often arranged in three stages.

Finally, a cover to protect the PWB components ordinarily is installed on the chassis.

External cable connecting terminals are mounted on the bottom side of each printed board and are arranged in the order of main circuit PWB, control circuit PWB, and option circuit PWB. The terminals on a lower PWB usually has a shorter length than those on a PWB above, and the terminal blocks are placed on the side of each PWB. This arrangement presents great difficulty for the connection of a large number of wires to a single controller and the arrangement of a plurality of controllers on a single panel. This difficulty can be better understood from a consideration of the sizes and numbers of wires that must be connected to a conventional controller with presently available functions.

The number of external cable connecting terminal blocks and cable sizes for 200 V 3.7K inverters are as follows:

|  | number of terminals | cable size |
| --- | --- | --- |
| main circuit terminal block | 9 | 3.5 mm$^2$(AWG12) |
| control circuit terminal block | 30 | 0.75 mm$^2$(AWG18) |
| option circuit terminal block | 28 | 0.75 mm$^2$(AWG18) |

When every function is added to the inverter unit so that it can be used in every possible field as an industrial machine system, the product will become very complicated. Depending upon the way such unit actually is used, unnecessary functions may be provided. To avoid this problem, the control circuit PWB is equipped with certain basic functions which are commonly used and the option circuit PWB is provided with functions which will serve only for specific purposes. By selectively combining a customized option circuit PWB with a inverter unit main body, an efficient and economical inverter unit which is appropriate for specific applications, will be provided.

FIG. 13 is a schematic circuit diagram of an inverter unit 51, which is connected to a source of power via plug connectors 55A and to a motor M via connectors 55B for controlling the operation of the motor M. A main circuit PWB 53 in the unit has a diode module 53A and transistor module 53B at a first level. A control circuit PWB 54 is connected by wires to the main PWB and has terminals 56 for external connection. Optional circuit PWB modules 63A and 63B are connectable by a connector 64 to the control circuit PWB 54 and have external terminal blocks 65.

FIG. 9 is a plan view of an inverter unit known in the art. FIG. 10 is a sectional view taken along the plane 10—10 of FIG. 9.

In this inverter unit 51, a main circuit printed wiring board 53 and a control circuit printed wiring board 54 are contained and secured in an aluminum diecast chassis 52. The main circuit printed wiring board 53 and control circuit printed wiring board 54 are arranged in two stages. The main circuit PWB 53 is disposed in the lower position and the control circuit PWB 54 in the upper position. Within the chassis 52, the bottom of the main circuit PWB 53 is lower than that of the control circuit PWB 54.

A main circuit external cable connecting terminal block 55 is disposed and secured on the bottom of the main circuit PWB 53 which is exposed under the control circuit PWB 54

A control circuit external cable connecting terminal block 56 is disposed and secured to the bottom of the control circuit PWB 54.

A cover 57 is a protective cover for electronic components mounted on the control circuit PWB 54. A wiring cover 61 shown in FIG. 10, which is installed to the area of the main circuit external cable connecting terminal block 55 and control circuit external cable connecting terminal block 56, is removable as shown in FIG. 9.

Main circuit external cables 59 are all connected to the main circuit external cable connecting terminal block 55. Control circuit external cables 60 are all connected to the control circuit external cable connecting terminal block 56.

A rubber bushing 58 is fitted in an installation hole formed in the bottom side face of the chassis 52.

In the inverter unit 51, the main circuit external cables 59 for power supply, motor, etc. are directed into the chassis 52 through the rubber bushing 58 and the leading edges thereof are connected to the main circuit external cable connecting terminal block 55. Further, the control circuit external cables 60 for start, stop, speed setting and other signals are led into the chassis 52 through the rubber bushing 58 and the leading edges thereof are connected to the control circuit external cable connecting terminal block 56.

A related conventional design has been disclosed in Japanese Patent Disclosure Publication No. 105903 of 1990.

Another conventional design for an inverter unit is shown in FIGS. 11 and 12. FIG. 11 is a front view thereof and FIG. 12 is a vertical sectional view of FIG. 11. Referring to FIGS. 11 and 12, the numerals 52 to 57, 59 and 60 designate identical parts to those in FIGS. 9 and 10 and such parts will not be described here.

In this inverter unit 62, a main circuit PWB 53, a control circuit PWB 54, and an option circuit PWB 63 for implementing additional functions as an option are housed and secured in an aluminum diecast chassis 52. The printed wiring boards are arranged in three stages; the main circuit printed wiring board 53 is disposed in the lower position, the control circuit printed wiring board 54 in the middle position, and the option circuit printed wiring board 63 in the upper position. For electrical connections, the main circuit PWB 53 and control circuit PWB 54 are connected by a connector or a flat cable (not shown), and the control circuit PWB 54 and option circuit PWB 63 are connected by a connector 64.

Within the chassis 52, the bottom of the main circuit PWB 53 is lower than that of the control circuit PWB 54, and a main circuit external cable connecting terminal block 55 is disposed and secured to the exposed bottom of the main circuit PWB 53.

A control circuit external cable connecting terminal block 56 is disposed and secured to the bottom of the control circuit PWB 54. Similarly, an option external cable connecting terminal block 65 is disposed and secured in a plane (shown as horizontal) defined by the bottom of the option circuit PWB 63, which is connected with the control circuit PWB 54 by the cable or connector 64.

A cover 57 is a protective cover for electronic components mounted over the control circuit PWB 54 and option circuit PWB 63, and forms an opening in the positions of the main circuit external cable connecting terminal block 55, control circuit external cable connecting terminal block 56 and option circuit external cable connecting terminal block 65 so that the terminal blocks are exposed and may be viewed from the outside.

Main circuit external cables 59 are all connected to the main circuit external cable connecting terminal block 55. Control circuit external cables 60 are all connected to the control circuit external cable connecting terminal block 56. Option external cables 66 are all connected to the option external cable connecting terminal block 65.

A bottom cover 67 is designed to fit over the opening and protect the whole inverter unit 62 after the cover 57 is fitted and fixed and the external cables are connected to the corresponding terminal blocks.

In the inverter unit 62, the main circuit external cables 59 for power supply, motor, etc. are led into the chassis 52 and the leading edges thereof are connected to the main circuit external cable connecting terminal block 55. Further, the control circuit external cables 60 for start, stop, speed setting and other signals are directed into the chassis 52 and the leading edges thereof are connected to the control circuit external cable connecting terminal block 56. Similarly, the option external cables 66 are led into the chassis 52 and their leading edges are connected to the option external cable connecting terminal block 65.

As previously noted, conventional inverter units tend to have enhanced functions and the terminals of external cable connecting terminal blocks, particularly those of a control circuit external cable connecting terminal block, are increasing in number. On the other hand, the inverter units tend to be made more compact in size. As a result, if all of the external cable connecting terminal blocks are arranged in one direction as in the conventional inverter unit 51 shown in FIGS. 9 and 10, the number of stages increases and wiring space is reduced. Further, since the wiring gages will vary for different input and output connections of the inverter unit, and the number of terminal blocks is substantial, work on installing and maintaining the inverter unit becomes extremely difficult.

Also, since the control circuit external cables 60 hang down in front of the main circuit external cable connecting terminal block 55, it is difficult to check, for example, the terminal numbers or connected external cable numbers of the main circuit external cable connecting terminal block 55, rendering maintenance and inspection difficult.

The conventional inverter unit shown in FIGS. 11 and 12 also encounters problems. When the option printed wiring board of the inverter unit factory-shipped is to be installed, the cover, etc. must be removed and care must be taken so as not to touch the other parts, for fear of a short circuit other failure. In addition, when an option PWB is to be added after the external cables have been connected, all the external cables must be disconnected, the cover removed, and the option PWB then fitted.

SUMMARY OF THE INVENTION

Accordingly, an object of the invention is to provide a controlling apparatus which facilitates the maintenance and inspection of wiring.

A further object of the invention is to provide a controlling apparatus which not only allows an option printed wiring board to be installed easily after it is assembled and completed but also ensures that external cables are connected easily.

In this controlling apparatus, connecting terminal blocks are disposed in optimum positions for wiring work to provide sufficient wiring space, thereby ensuring ease of wiring work. Also, external cables connected to one terminal block can be routed so as not to conceal the other connecting terminal block.

According to the controlling apparatus of the a first embodiment of the present invention, at least one fuse terminal block is arranged in a first orthogonal (e.g., vertical) direction and then a second terminal block is arranged in a second orthogonal (e.g., horizontal) direction, with a difference in level given by installing the second terminal block in a lower position than the first terminal block. Also, sufficient wiring space is provided, ensuring ease of wiring work. External cables can be routed without covering and hiding the second terminal block, thereby facilitating installation and maintenance work.

According to the second embodiment of the invention, an option printed wiring board and a recess is provided in a cover of the inverter unit to allow an option case to be installed from the outside of the cover. In this manner, an option can be added at a desired time, and when the inverter unit is to be changed due to its failure, etc., the option installed can be removed without requiring the external cables to be disconnected.

According to a further feature of the invention, a control circuit printed wiring board is disposed on a first top portion of a main circuit printed wiring board and an option printed wiring board on a second top portion thereof to arrange the terminal blocks in a U pattern. In this manner, external cables can be routed easily and wiring can be facilitated.

DESCRIPTION OF THE PREFERRED EMBODIMENTS

Figure 2:
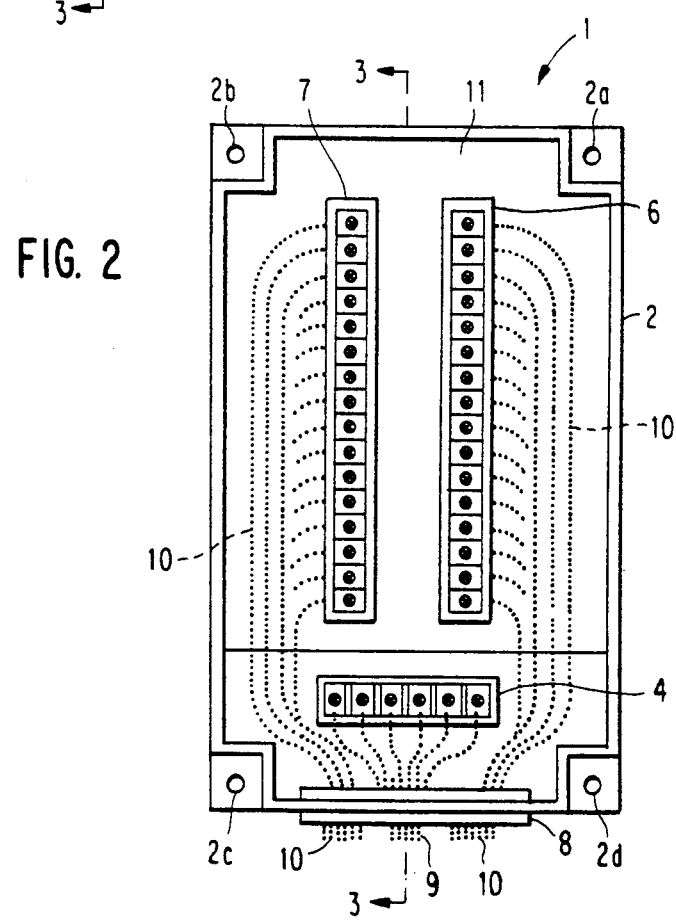
FIG. 2 is a front view exposing the inside of the inverter unit according to a preferred embodiment of the invention.
Figure 3:
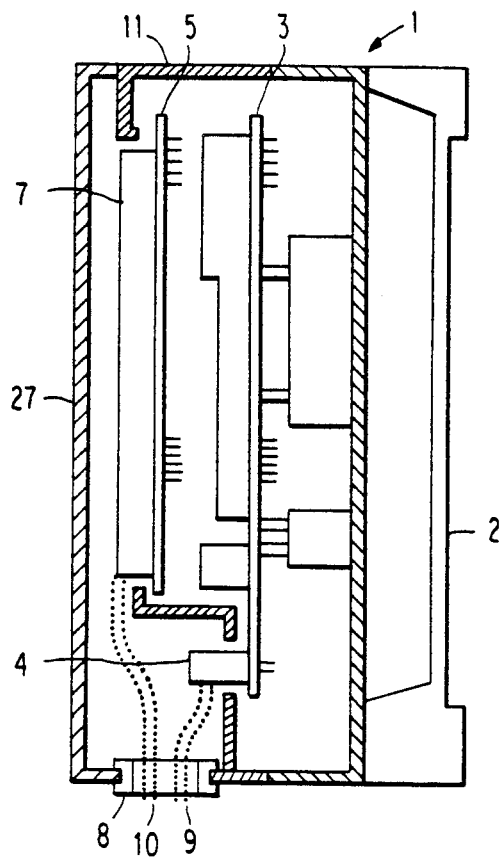
FIG. 3 is a sectional view taken along the plane 3—3 of FIG. 2.

An inverter unit according to a first embodiment of the present first invention will now be described with reference to FIGS. 1 to 3.

Figure 1:
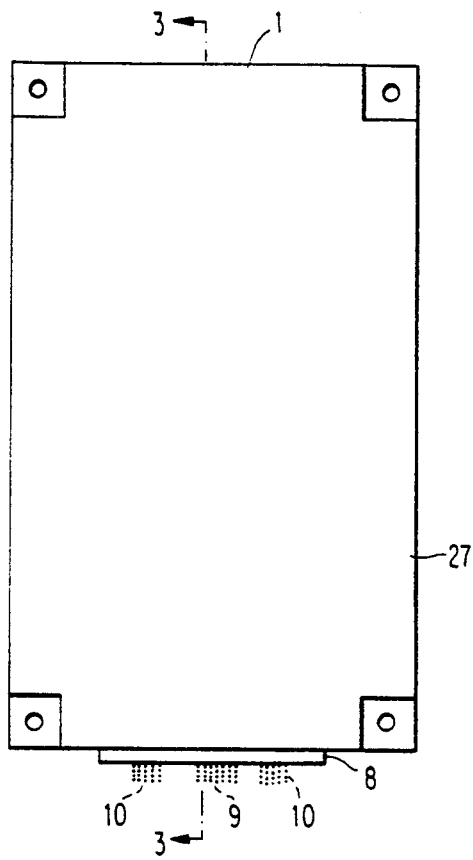
FIG. 1 is an external front view of an inverter unit according to a preferred embodiment of the invention.

FIG. 1 is an external front view of an inverter unit 1, wherein the numeral 27 indicates a front cover, 8 designates a rubber bushing, 9 represents main circuit external cables and 10 control circuit external cables. FIG. 2 is a front view illustrating internal terminal blocks which have been exposed by removing the front cover 27. FIG. 3 is a sectional view taken along the plane 3—3 of FIG. 2 (it should be noted that the front cover 27 remains installed in this Figure).

Mounting holes 2a, 2b, 2c and 2d for installation onto a wall surface or the like are formed on the four corners of the bottom of a chassis 2. The main circuit PWB 3 is placed in the chassis 2 and is mounted with screws in the vicinity of the internal bottom of the chassis 2.

A main circuit external cable connecting terminal block 4 is disposed and mounted in the first orthogonal (horizontal) direction on the bottom of the main circuit PWB 3.

A control circuit PWB 5 also is disposed within the chassis 2 but at a position above the main circuit PWB 3. On the control circuit PWB 5, two control circuit external cable connecting terminal blocks 6 and 7 are arranged in a second orthogonal (vertical) direction with a space provided therebetween.

The main circuit external cables 9 connected to the main circuit external cable connecting terminal block 4 are led to the outside through the rubber bushing 8. The control circuit external cables 10 connected to the control circuit external cable connecting terminal blocks 6, 7 are also directed to the outside through the rubber bushing 8.

A cover 11 is used for protection of components mounted on the control circuit printed wiring board 5 and main circuit printed wiring board 3. The cover 11 is shaped to be identical to the external shape of the opening of the chassis 2, and is open in the positions of the main circuit external cable connecting terminal block 4 and control circuit external cable connecting terminal blocks 6, 7 so that the terminal blocks may be exposed and seen from the outside.

Installation of a controlling apparatus using the present invention comprises the following steps:

(1) Remove the front cover 27.
(2) Insert the main circuit external cables 9 for power supply and load motor into the chassis 2 through the rubber bushing 8 and connect them to the main circuit external cable connecting terminal block 4.
(3) Insert the control circuit external cables 10 for start, stop, speed setting and other signals into the chassis 2 through the rubber bushing 8, route them upward perpendicularly past both ends of the main circuit external cable connecting terminal block 4, and connect them to the two vertically disposed control circuit external cable connecting terminal blocks 6, 7 from the outsides thereof.
(4) Finally, reinstall the front cover 27.

In the inverter unit 1, the control circuit external cables 10 do not pass before the main circuit external cable connecting terminal block 4 and are connected to the control circuit external cable connecting terminal blocks 6, 7 from the outsides thereof, allowing wiring to be done without the cables hanging down in front of the main circuit external cable connecting terminal block 4. As a result, it will be easy to check terminal numbers and tighten terminal screws, ensuring ease of wiring and maintenance work.

It will be recognized that the two control circuit terminal blocks disposed in the second orthogonal (vertical) direction in the first embodiment may be either on the right- or left-hand side.

A second embodiment of the invention will now be described with reference to FIGS. 4 to 8.

Figure 4:
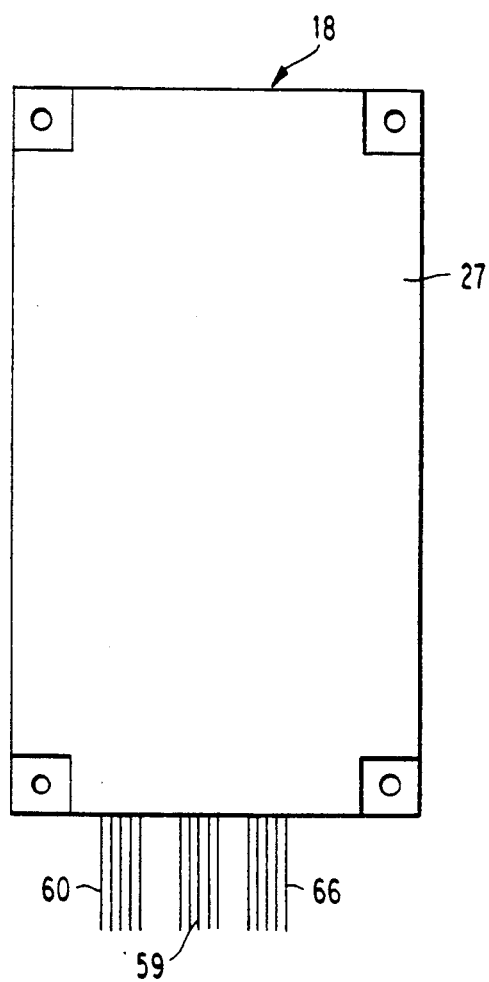
FIG. 4 is an external front view of an inverter unit according to a second embodiment of the invention.
Figure 5:
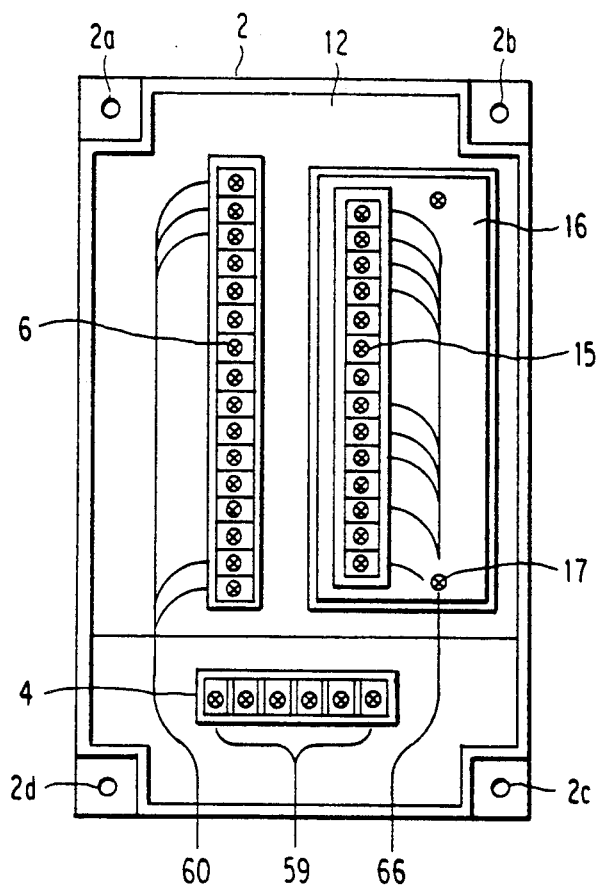
FIG. 5 is a front view exposing the inside of the inverter unit according to the second embodiment of the invention.
Figure 6:
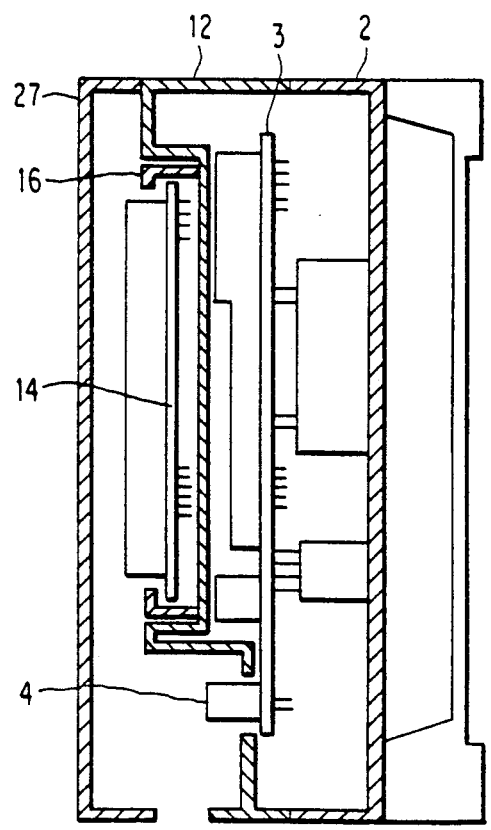
FIG. 6 is a cross sectional view of FIG. 5.
Figure 7:
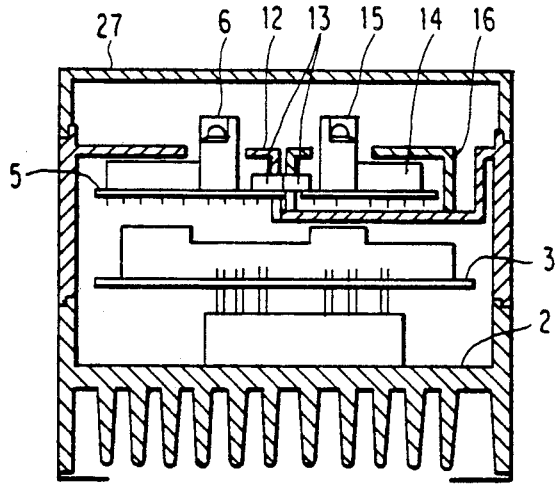
FIG. 7 is a vertical sectional view of FIG. 5.
Figure 8:
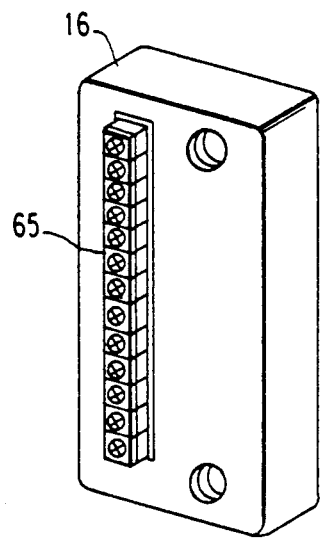
FIG. 8 is an external view showing an option case mounted with an option printed wiring board according to the second embodiment of the invention.
Figure 9:
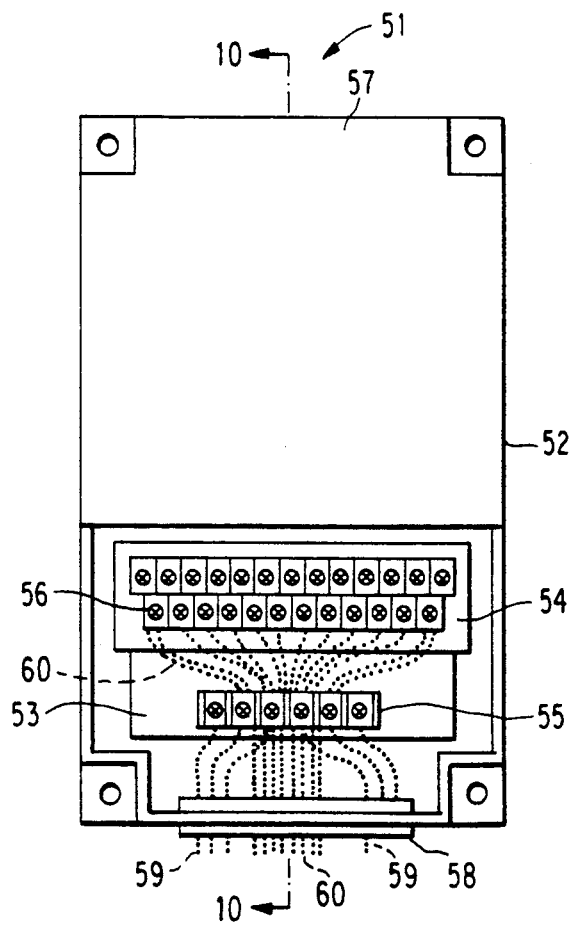
FIG. 9 is a front view of a conventional inverter unit from which a wiring cover has been removed.
Figure 12:
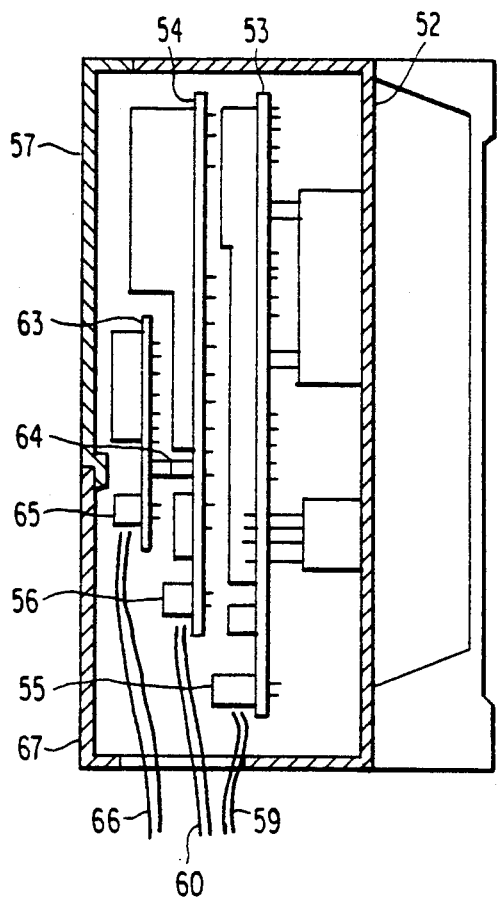
FIG. 12 is a vertical sectional view of FIG. 11.
Figure 13:
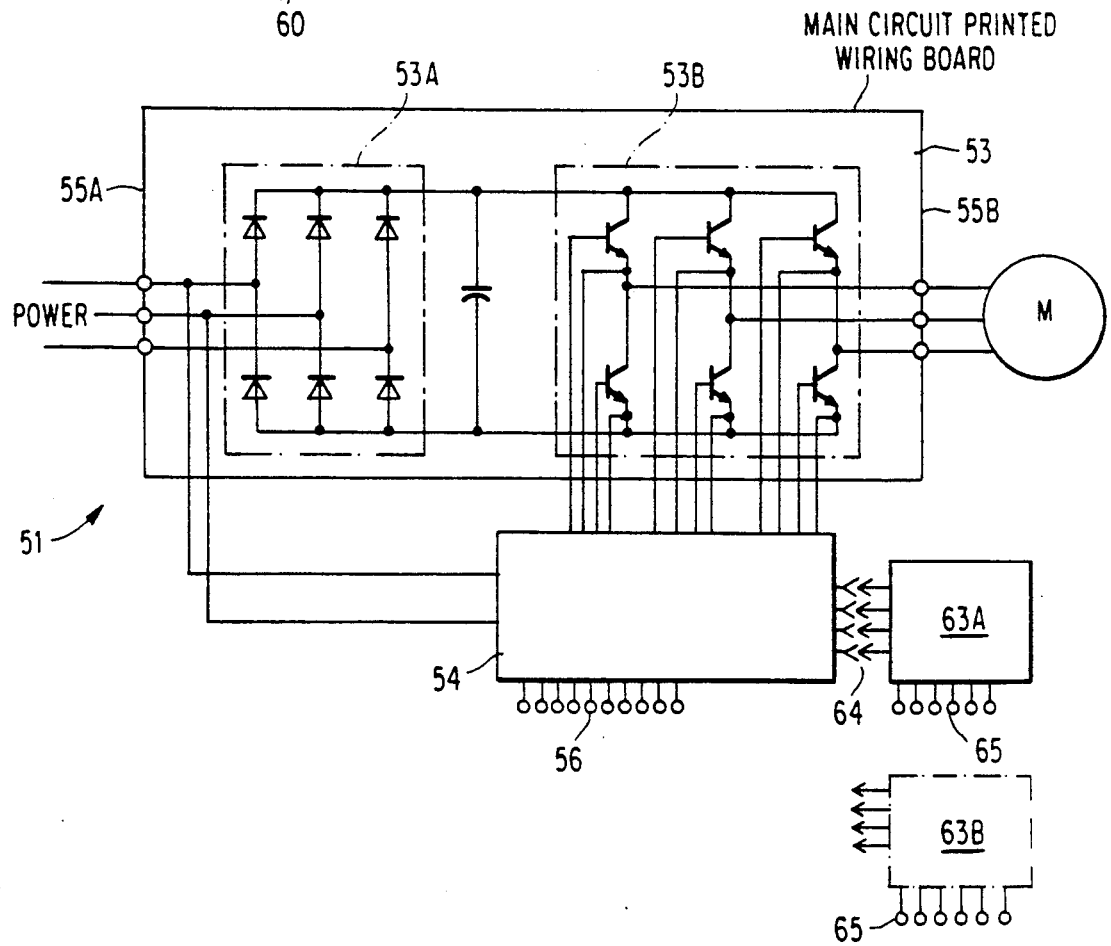
FIG. 13 is a schematic circuit diagram of a conventional inverter unit.
Figure 10:
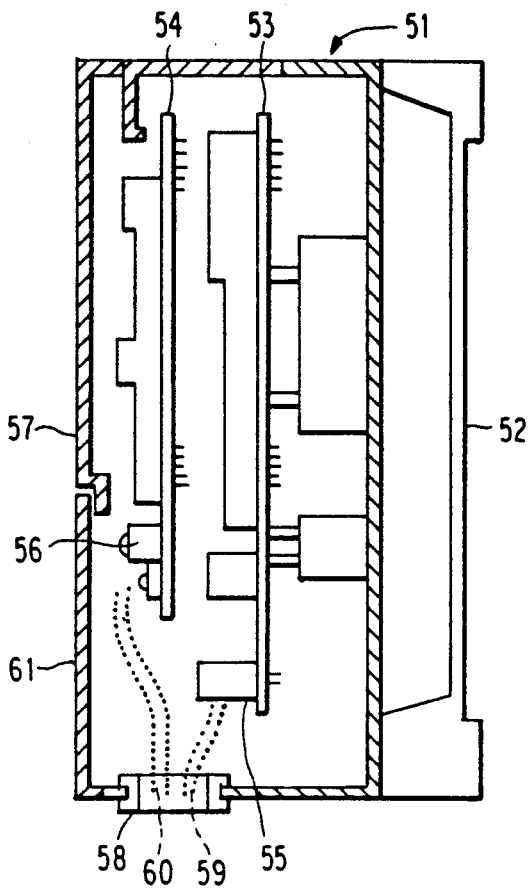
FIG. 10 is a sectional view taken along the plane X—X of FIG. 9.
Figure 11:
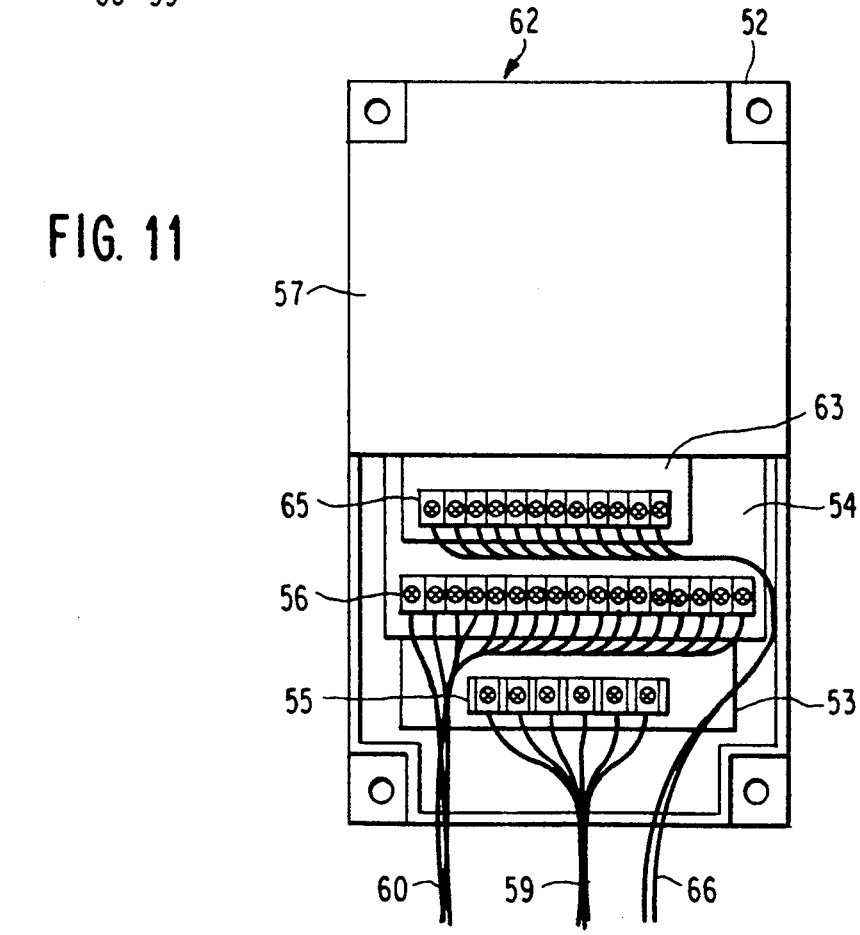
FIG. 11 is a front view exposing the inside of the inverter unit known in the art.

FIG. 4 is an external front view of an inverter unit 18, wherein 27 indicates a front cover, 59 represents main circuit external cables, 60 control circuit external cables, and 66 option external cables. FIG. 5 is a front view illustrating internal terminal blocks which have been exposed by removing the front cover 27. FIGS. 6 and 7 are cross sectional view and vertical sectional view of FIG. 5, respectively, and FIG. 8 is an external view showing an option case mounted with an option printed wiring board.

On a control circuit printed wiring board 5, as shown in FIG. 7, a control circuit external cable connecting terminal block 6 is disposed and installed in the vertical direction. A plastic cover 12 is used for protection of components mounted on the control circuit printed wiring board 5 and a main circuit printed wiring board 3. The cover 12 is configured to be identical to the external shape of the opening of a chassis 2. It also is high enough so as to protect the components on the control circuit printed wiring board 5. Finally, it is recessed on the right-hand side so as to be high enough to protect the components on the main circuit printed wiring board 3. In addition, the cover 12 is open in the positions of a main circuit external cable connecting terminal block 4 and the control circuit external cable connecting terminal block 6 so that the terminal blocks may be exposed and viewed from the outside, and is also open in the position of a connector section 13 of the control circuit PWB 5.

Both the control circuit PWB 5 and the option circuit PWB 14 are constructed with mating projecting/recess-types of connectors, which permit quick ("one-touch") connect/disconnect of the option circuit PWB. The option case 16 which accommodates option PWB 14 is engaged into a recessed portion of the cover 12, then its connectors are inserted into the corresponding connectors of control circuit PWB, by which electrical connection is completed. By directly connecting with mated projection/recess connectors, installation using cables or wires will be unnecessary. The option circuit PWB can be easily secured with screws.

On option printed wiring board 14, an option external cable connecting terminal block 15 is disposed an installed in the vertical direction. The option printed wiring board 14 is housed in an option case 16 and is open in its front face where the option external cable connecting terminal block 15 is located, thereby exposing the terminal block.

The option printed wiring board 14 housed in the option case 16 is fitted into the recess of the cover 12 and inserted into the connector 13 for making electrical connection. The option case 16 is fastened to the cover 12 by screws 17.

In assembling the connection assembly, first the front cover 27 is removed. When the option printed wiring board 14 is necessary, fit the option printed wiring board 14 housed in the option case 16 into the right-hand side recess of the cover 12 and insert it into the connector 13. Fasten the option case 16 to the cover 12 by means of the screws 17. Insert the main circuit external cables 59 from the bottom into the cover 12 and connect them to the main circuit external cable connecting terminal block 4. Insert the control circuit external cables 60 (for start, stop, speed setting and other control signals) from the bottom into the cover 12, route them upward perpendicularly on the left-hand side, and connect them to the vertically disposed control circuit external cable connecting terminal block 6 from the outside thereof. In a similar manner, also insert the option external cables 66 from the bottom into the cover 12, route them upward perpendicularly on the right-hand side, and connect them to the vertically disposed option external cable connecting terminal block 15 from the outside thereof. Finally, reinstall the front cover 27. In the inverter unit 18, the option printed wiring board 14 contained in the option case 16 can be installed optionally after the cover 12 has been placed on the inverter unit. Also, when the inverter unit is to be replaced after wiring is complete, the option printed wiring board 14 can be removed from the inverter unit, with the external cables remaining intact, and reinstalled to a new inverter unit.

It will be appreciated that the control circui printed wiring board disposed on the left-hand side and the option printed wiring board on the right-hand side in an embodiment may be installed in opposite positions. It should be noted that the present invention is applicable to not only the inverter units but also general compact controlling apparatuses.

The entire disclosure of each and every foreign patent application from which the benefit of foreign priority has been claimed in the present application is incorporated herein by reference, as if fully set forth.

Although this invention has been described in a least one preferred form with a certain degree of particularity, it is to be understood that the present disclosure of the preferred embodiment has been made only by way of example and that numerous changes in the details and arrangement of components may be made without departing from the spirit and scope of the invention as hereinafter claimed.

What is claimed is:

1. An inverter unit comprising:
   a chassis defining an enclosure having at least a base and side portions;
   a main circuit printed wiring board mounted within said chassis enclosure, proximate said bottom portion of said enclosure, and having a main circuit terminal block;
   a control circuit printed wiring board mounted over said main circuit printed circuit board, and having at least one control circuit terminal block;
   wherein said main circuit terminal block is disposed in a first orthogonal direction, said control circuit terminal block being disposed in a second orthogonal direction, and said main circuit terminal block being disposed below said control circuit terminal block.

2. The inverter unit as set forth in claim 1 wherein said chassis enclosure comprises a top portion, an area of said portion being open proximate said terminal blocks, and further comprises a cover for said opening.

3. A machine controller apparatus comprising:
   a chassis defining an enclosure having at least a bottom and side portions;
   a main circuit printed wiring board mounted within said chassis enclosure, proximate said bottom portion of said enclosure, and having a main circuit terminal block at a first level;
   a control circuit printed wiring board mounted over said main circuit printed circuit board, and having at least one control circuit terminal block at a second level; and
   an option printed wiring board, mounted on said control circuit printed wiring board and operatively connected thereto, comprising an option terminal block,
   wherein said control circuit printed wiring board and option printed wiring board are disposed in parallel and said control circuit and option terminal blocks are disposed substantially perpendicularly to said main circuit terminal block and said first level is different from said second level.

4. The controller apparatus of claim 3 wherein said option terminal blocks ar substantially at said second level.

5. The controller apparatus of claim 3 wherein said option printed wiring board and said control circuit wiring board each comprise mated snap-in electrical connection means for permitting quick installation and removal of said option board.

6. The controller apparatus of claim 5 wherein said chassis further comprises a top portion having a receptacle for removably receiving said option circuit wiring board.

7. An inverter apparatus comprising:
a main circuit printed wiring board;
a control circuit printed wiring board;
a case for accommodating said main circuit printed wiring board and control circuit printed wiring board disposed substantially parallelly with each other;
an option printed wiring board;
a case cover wrapping said case containing said main circuit printed wiring board and control circuit printed wiring board and having a recess formed for accommodating said option printed wiring board substantially parallelly with said control circuit printed wiring board; and
an option printed wiring board cover wrapping said option printed wiring board contained in the recess of said case cover.

8. The inverter apparatus of claim 7 comprising connecting means on each of said option printed wiring board cover and case cover for releasably mechanically and electrically connecting said option printed wiring board and control circuit wiring board.

* * * * *